(12) United States Patent
Mottonen et al.

(10) Patent No.: US 11,442,086 B2
(45) Date of Patent: Sep. 13, 2022

(54) MICROWAVE RADIATION DETECTOR

(71) Applicant: IQM Finland Oy, Espoo (FI)

(72) Inventors: Mikko Mottonen, Espoo (FI); Roope Kokkoniemi, Helsinki (FI); Visa Vesterinen, Espoo (FI); Russell Lake, Boulder, CO (US)

(73) Assignee: IQM Finland Oy, Espoo (FI)

( * ) Notice: Subject to any disclaimer, the term of this patent is extended or adjusted under 35 U.S.C. 154(b) by 195 days.

(21) Appl. No.: 16/766,152

(22) PCT Filed: Nov. 22, 2018

(86) PCT No.: PCT/FI2018/050851
§ 371 (c)(1),
(2) Date: May 21, 2020

(87) PCT Pub. No.: WO2019/102071
PCT Pub. Date: May 31, 2019

(65) Prior Publication Data
US 2020/0284825 A1    Sep. 10, 2020

(30) Foreign Application Priority Data
Nov. 23, 2017   (FI) .................................... 20176051

(51) Int. Cl.
*G01R 21/02*    (2006.01)
*G01K 7/00*    (2006.01)
(Continued)

(52) U.S. Cl.
CPC ............. *G01R 21/02* (2013.01); *G01K 7/006* (2013.01); *G01K 11/006* (2013.01); *H01L 39/223* (2013.01)

(58) Field of Classification Search
CPC .......... G01J 5/20; G01J 2005/208; G01J 5/10; G01J 1/42; G01J 5/061; G01J 5/0853;
(Continued)

(56) References Cited

U.S. PATENT DOCUMENTS 3,842,349 A    10/1974  Cox et al.
3,906,231 A *  9/1975  Fletcher ..................... G01J 5/10
                                                250/370.15
(Continued)

FOREIGN PATENT DOCUMENTS

FI           122887 B       3/2012
RU          2227346 C1      4/2004
(Continued)

OTHER PUBLICATIONS

J.T. Peltonen et al., "Thermal Conductance by the Inverse Proximity Effect in a Superconductor," PRL 105, 097004 (2010), Physical Review Letters, Aug. 27, 2010, The American Physical Society, pp. 097004-1-097004-4.
(Continued)

*Primary Examiner* — Vinh P Nguyen
(74) *Attorney, Agent, or Firm* — K&L Gates LLP

(57) ABSTRACT

A detector of microwave radiation includes a signal input and a detector output. An absorber element of ohmic conductivity is coupled to said signal input through a first length of superconductor. A variable impedance element, the impedance of which is configured to change as a function of temperature, is coupled to the detector output through a second length of superconductor. The detector also includes a heating input and a heating element coupled to the heating input through a third length of superconductor. The absorber element, the variable impedance element, and the heating element are coupled to each other through superconductor
(Continued)

sections of lengths shorter than any of said first, second, and third lengths of superconductor.

13 Claims, 3 Drawing Sheets

(51) Int. Cl.
  *G01K 11/00* (2006.01)
  *H01L 39/22* (2006.01)
(58) Field of Classification Search
  CPC ...... G01J 5/58; G01J 5/00; G01J 5/12; G01K 7/006; G01K 11/006; G01K 15/002; G06F 3/046; G01R 21/02; G01R 33/0354; G01R 19/225; G01R 21/14; G01R 33/10; G01R 33/16; G01R 29/0878; G01R 33/0047; G01R 33/02; G01R 33/4806; H01L 39/00; H01L 39/12; H01L 23/48; H01L 39/143; H01L 39/225; H01L 39/223
  See application file for complete search history.

(56) References Cited

U.S. PATENT DOCUMENTS

| | | | | |
|---|---|---|---|---|
| 4,869,598 | A * | 9/1989 | McDonald | G01K 7/006 374/176 |
| 4,901,006 | A | 2/1990 | Harrison | |
| 5,043,580 | A * | 8/1991 | Hartemann | H01L 39/10 505/848 |
| 5,285,067 | A * | 2/1994 | Culbertson | G01J 5/10 250/336.2 |
| 5,378,873 | A | 1/1995 | Katzman | |
| 5,783,805 | A | 7/1998 | Katzmann | |
| 9,255,839 | B2 | 2/2016 | Mottonen et al. | |
| 9,818,064 | B1 * | 11/2017 | Abdo | G01R 29/0814 |
| 9,964,446 | B2 * | 5/2018 | Gunnarsson | H01L 39/22 |
| 11,210,601 | B2 * | 12/2021 | Mottonen | H01L 23/3735 |
| 2013/0281302 | A1 | 10/2013 | Moettoenen et al. | |

FOREIGN PATENT DOCUMENTS

RU 2437189 C1 12/2011
WO 2009101257 A1 8/2009

OTHER PUBLICATIONS

Govenius, J. et al. Microwave nanobolometer based on promimity Josephson junctions, arSiv: 1403:6586V2[cond-mat.mes-hall].arXiv.org, Cornell University Library [online], vol. 90, No. 6, Jul. 30, 2014 https://arxiv.org/labs/1403.6586v2—abstract; p. 1, right column; section II, first paragraph; p. 3, right column; p. 4, right column; p. 5, left column; Appendix A; Fig. 1.
Govenius, J. et al. Detection of Zeptojoule Microwave Pulses Using Electrothermal Feedback in Proximity-Induced Josephson Junctions, In; Physical Review Letters, College Park, MD US: American Physical Society [online], Jul. 15, 2016, vol. 117, No. 3, Art. No. 030802, pp. 1-6 https://journals.aps.org/prl/abstract/10.1103/PhysRevLett.117.030802.
Clark, J. et al. Superconductive bolometers for submillimeter wavelengths, Journal of Applied Physics, vol. 48, No. 12, Dec. 1, 1977.
Finnish Patent and Registration Office Search Report—Application No. 20176051 dated Jun. 11, 2018.
Written Opinion—PCT/FI2018/050851 dated Feb. 27, 2019.
Search Report—PCT/FI2018/050851 dated Feb. 27, 2019.
Decision to Grant issued to corresponding Russian Application No. 2020118472/11, dated Jan. 27, 2022, 13 pages.

* cited by examiner

MICROWAVE RADIATION DETECTOR

PRIORITY CLAIM

This application is a national phase entry of PCT/FI2018/050851, filed on Nov. 22, 2018, which claims priority to Finnish Patent Application No. 20176051, filed on Nov. 23, 2017, the entire disclosures of which are incorporated by reference herein.

FIELD OF THE INVENTION

The invention is related to the field of detecting and measuring of electromagnetic energy at microwave frequencies. In particular the invention is related to an ultrasensitive detector structure and arrangement that can detect microwave signals of extremely small magnitude.

BACKGROUND

Ultrasensitive detection methods of received electromagnetic radiation comprise calorimetry and bolometry. A calorimeter is a device in which the momentarily increased temperature of a detector element decays exponentially towards that of a surrounding thermal bath. A bolometer has a detector element and a thermal bath, but the approach is to measure power (energy over time), i.e. the mean flux of incoming photons, rather than the exact energy of a single photon.

The schematic illustration of FIG. 1 is, as such, applicable to both a calorimeter and a bolometer. Incoming radiation 101 is absorbed in an absorber 102, so that the absorbed energy heats up a detector element 103, the heat capacity of which is C. The absorbed thermal energy is subsequently lost to a heat sink or thermal bath 104 through some thermal conductivity G. A measurement arrangement 105 is used to detect and measure either the temperature of the detector element 103 as an absolute value, and/or related quantities like the rate of change of the temperature.

In order for a bolometer to "keep up" with changes in the power of the incoming signal, the changes must be slow in relation to the thermal time constant of the system, which is essentially C/G. In other words, to make a bolometer sensitive to fast changes would require having a small C and a large G. On the other hand, the thermodynamical lower bound for the noise equivalent power of the system is proportional to the square root of $4*k_B*T^2*G$, where $k_B$ is Boltzmann's constant and T is the temperature of the thermal bath. Thus in order to keep noise low one should make G small and T low.

FIG. 2 is a schematic illustration of a known ultrasensitive bolometer. The detector element comprises a microscopic length of material that is ohmically conductive and does not become intrinsically superconductive even at low temperatures. This so-called normal conductor can be made of e.g. a gold-palladium alloy, and in the detector structure it comprises a so-called long section 201 and a short section 202. The structure comprises also superconductor parts, i.e. pieces made of a material like aluminum or other metal that becomes superconductive at the temperatures to which the detector is cooled for operation. The superconductor parts comprise an input section 203 coupled to one end of the long section 201, and an output section 204 coupled to one end of the short section 202. A bridge section 205 is placed across the normal conductor so that it divides its length into the long section 201 and short section 202. One end of the bridge section 205 is grounded through a capacitive coupling. All sections listed above are enclosed in the thermal bath 206.

The short section 202 is short enough, and bound by superconductor sections at its both ends, so that at the low temperature of the thermal bath the proximity effect makes it weakly superconductive, whereas the long section 201 mostly retains its ohmic conductivity. The short section 202 also constitutes a part of a tank circuit, so that its impedance (which, due to said weak superconductivity, depends strongly on temperature) in the tank circuit has a significant effect on the resonance frequency of the tank circuit. The incoming microwave signal heats up the long section 201, resulting in a corresponding temperature increase also in the short section 202. A resonance frequency measurement circuit 207 measures the resulting change in the resonance frequency of the tank circuit, so that the output of the resonance frequency measurement circuit 207 reveals the power of the incoming microwave signal.

FIG. 3 illustrates a variation of the principle of FIG. 2. The difference to FIG. 2 is that in FIG. 3 the detector element comprises a number of short sections 301, 302, and 303. This helps to increase the impedance of the measurement circuit without making it non-linear, but the general operating principle is the same as in FIG. 2.

Although the detectors of FIGS. 2 and 3 are extremely sensitive, they involve problems related to their calibration. Very small variations in the manufacturing process introduce significant uncertainty in the measurement response. Basically it would be possible to calibrate each manufactured bolometer individually using some known source of microwave radiation, but producing the required reference signals on microwave frequencies at the required accuracy is difficult and expensive.

Prior art documents that describe known high-sensitivity bolometers comprise for example patent publications FI122887B and U.S. Pat. No. 9,255,839B2.

SUMMARY

It is an objective of the present invention to present a detector and detector arrangement for detecting microwave radiation with extremely high sensitivity and relative ease of calibration. Another objective of the invention is to present a method and devices for calibrating a detector of microwave radiation without causing significant increase in the heat capacity of the detector element. Yet another objective of the invention is to present a detector of microwave radiation of the kind described above so that inevitable variations in the manufacturing process do not sacrifice the sensitivity and accuracy of the manufactured detectors.

These and further advantageous objectives of the invention are achieved by providing a heating element in the detector that is closely enough coupled to the other parts of the detector so that the hot electron effect can be exploited, while simultaneously using long enough superconducting leads to block stray heat conduction carried by quasiparticle thermal transport.

A detector of microwave radiation according to an embodiment is characterized by the features recited in the independent claim directed to a detector.

A detector arrangement of microwave radiation according to an embodiment is characterized by the features recited in the independent claim directed to a detector arrangement.

BRIEF DESCRIPTION OF THE DRAWINGS

The accompanying drawings, which are included to provide a further understanding of the invention and constitute a part of this specification, illustrate embodiments of the invention and together with the description help to explain the principles of the invention. In the drawings.

DETAILED DESCRIPTION

Figures 4, 5, 6:
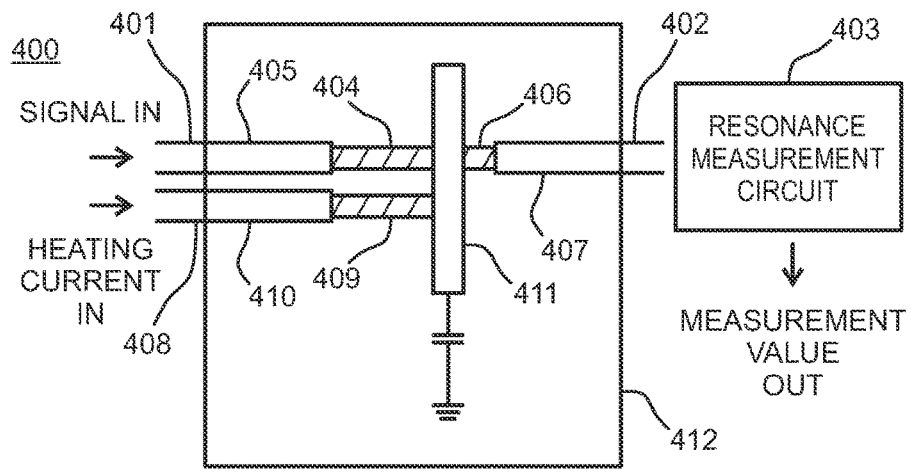
FIG. 4 illustrates a detector according to an embodiment.
FIG. 5 illustrates the use of filters.
FIG. 6 illustrates an example of connections in a detector according to an embodiment.

FIG. 4 illustrates a detector 400 of microwave radiation. The detector comprises a signal input 401 and a detector output 402. The signal input 401 is a connection through which a signal to be measured can be coupled into the detector, using a signal input transmission line. The detector output 402 is a connection through which the detector can be coupled to a measurement circuit. According to an embodiment the measurement circuit is a resonance measurement circuit 403.

The detector comprises an absorber element that exhibits ohmic conductivity at microwave frequencies. In FIG. 4 the absorber element is a so-called long section 404 made of an ohmically conductive material that does not become intrinsically superconductive at the temperatures to which the detector is cooled for operation. As a material of the absorber element one could use a material that becomes weakly superconductive for DC, as long as ohmic conductivity is observed at the frequencies of interest. High-frequency photons may break the Cooper pairs of a (weakly) superconductive material and thus become absorbed.

Examples of suitable materials for manufacturing an absorber element are for example various alloys of gold and palladium, but also other metals like copper, and even non-metallic materials like graphene, carbon nanotubes or the like could be used. The length of the long section 404 may be in the order of several hundreds of nanometers, like 600-1000 nanometers, and its width and thickness can be as small as can be reliably manufactured with microlitographic methods. At the time of writing this description this means a thickness in the order of nanometers to some tens of nanometers, and a width in the orders of some tens of nanometers.

The absorber element is coupled to the signal input 401 through a first length 405 of superconductor. Calling a material a superconductor means that the material becomes superconductive at the temperatures to which the detector is cooled for operation. An example of such materials is aluminum, but also other superconductor materials like molybdenum, niobium, tin, tantalum, or lead can be used. For operation, the detector is cooled to a very low temperature, which can be well under one kelvin, or in the order of some tens of millikelvins.

The dimensions of the structure, as well as the way in which the absorber element is coupled to the first length 405 of superconductor, have an effect on impedance matching. In order to ensure as complete absorption of microwave photons to the absorber element as possible it is advantageous to match the impedance of the absorber element as accurately as possible to the characteristic impedance of the signal input transmission line, the final part of which is the first length 405 of superconductor. As such, aiming at good impedance matching is more important than aiming at any particular physical dimensions of the absorber element. Impedance matching of microelectronic elements is a technique known as such, so it does not need to be discussed here in detail.

The detector comprises a variable impedance element, the impedance of which is configured to change as a function of temperature. While the impedance of more or less all materials exhibits some dependency on temperature, this characterization of the variable impedance element means that its material, form, and dimensions are selected such that its impedance exhibits considerable dependency on temperature at the temperatures to which the detector is cooled for operation. Temperature dependency is considerable in this sense if a change of temperature in the order of magnitude that will result from the absorption of an amount of microwave radiation of interest suffices to change the impedance of the variable impedance element that is detectable with a practical measurement circuit.

An example of a variable impedance element is a so-called short section 406 made of an ohmically conductive material, coupled to some superconductive material at at least two distinct points. The material of the short section 406 may be for example the same as that of the long section 404, or it may be one of the other materials given as examples in the description of the long section 404 above.

The dimensions of the short section 406, and its coupling to the superconductive material at said at least two distinct points, are such that the structure constitutes a Josephson junction of the S-N-S type. The structure may also be characterized so that the proximity effect caused by the nearby superconductor sections makes the short section 406 weakly superconductive at the temperatures to which the detector is cooled for operation. An example of a variable impedance element of this kind is a strip of gold-palladium alloy with a length in the order of 200 nanometres between two superconductive electrodes.

A Josephson junction of the S-N-S type is particularly advantageous for use as a variable impedance element, because its inductance is known to exhibit significant dependence on temperature. Electrically such a junction can be considered as the equivalent of a coil, the inductance of which is a function of temperature.

The variable impedance element is coupled to the detector output 402 through a second length 407 of superconductor. Thus it is possible for the measurement circuit to include the variable impedance element in an electric circuit, the electric properties of which are measured so that detected changes in said electric properties form the basis of producing a measurement signal. As an example, if a resonance measurement circuit 403 is used, the variable impedance element can be included in a tank circuit, the resonance frequency of which is to be measured.

Figure 1:
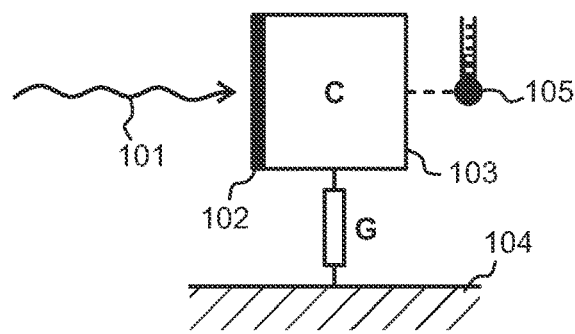
FIG. 1 illustrates the known principle of a calorimeter or bolometer.
Figure 2:
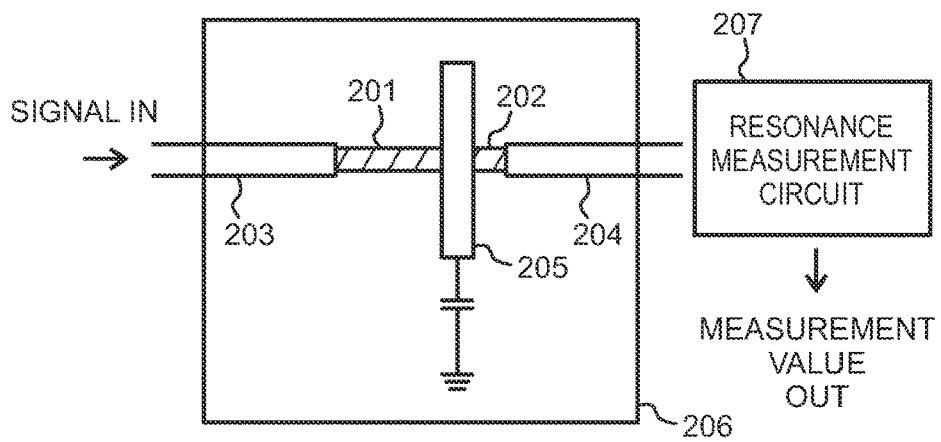
FIG. 2 illustrates the detector element of a known bolometer.
Figure 3:
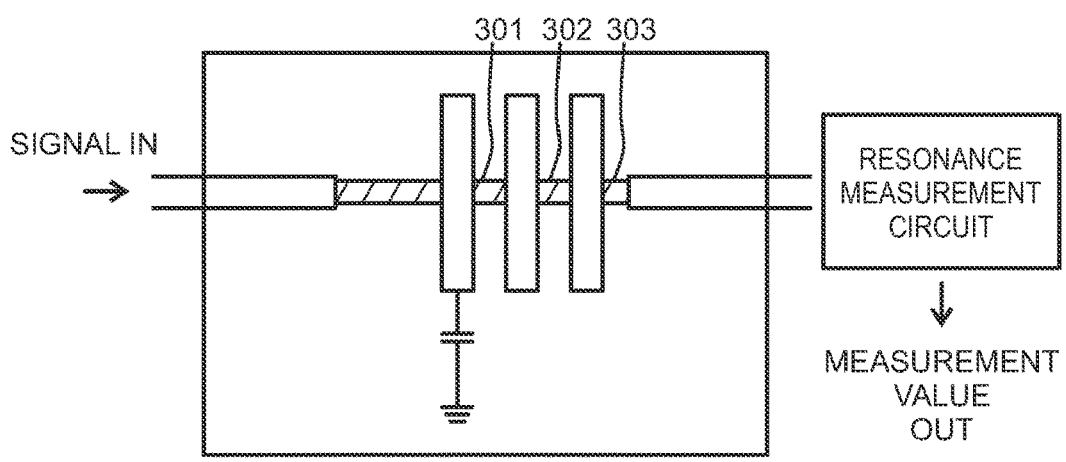
FIG. 3 illustrates the detector element of another known bolometer.

As a difference to the known detector elements of FIGS. 2 and 3, the detector of FIG. 4 comprises a heating input 408 and a heating element 409 coupled to the heating input 408 through a third length 410 of superconductor. The heating element 409 can be made of ohmically conductive material, so that a heating current coupled to it will experience ohmic loss, converting incoming electric energy into thermal energy.

The absorber element (the long section 404), the variable impedance element (the short section 406), and the heating element 409 are coupled to each other through superconductor sections of lengths shorter than any of the first 405, second 407, or third 410 lengths of superconductor. In the schematic illustration of FIG. 4 a superconductive strip 411 couples together the free ends of the three, i.e. that end of the long section 404 that is not coupled to the signal input 401, that end of the short section 406 that is not coupled to the detector output 402, and that end of the heating element 409 that is not coupled to the heating input 408. The shortest distances through superconductive material from one of the long section 404, short section 406, or heating element 409 to another is most advantageously as short as can be reliably manufactured with the technology used.

In the embodiment of FIG. 4 the superconductive strip 411 is also used for a capacitive coupling to ground potential. Since the superconductive strip 411 is coupled both to the long section 404 and to the short section 406, the coupling to ground closes the circuit for both of them, enabling the effective absorption of the input signal in the absorber element and also enabling effective use of the variable impedance element as a part of a tank circuit, the resonance frequency of which is to be measured. As such, the closing of said circuits could be made also in other ways, but the use of the superconductive strip 411 offers a structurally simple way that is relatively straightforward to manufacture.

The Wiedemann-Franz law has been found to not hold for superconductors: a material that is electrically superconductive may be thermally a relatively good insulator, blocking particularly thermal conduction through electron diffusion and quasiparticle thermal transport. Thus when the long section 404, short section 406, and heating element 409 are coupled to each other through only relatively short superconductor sections but to other parts of the arrangement through longer superconductor sections, they can exchange thermal energy with each other—in the form of hot electron diffusion through the short superconductor sections—much more easily than with anything outside the detector area. A characterization of how the heat conductivity of a superconductor section depends on its length is found for example in J. T. Peltonen, P. Virtanen, M. Meschke, J. V. Koski, T. T. Heikkilä, and J. P. Pekola: Thermal Conductance by the Inverse Proximity Effect in a Superconductor, Physical Review Letters 105, 097004 (2010).

Also other features of the structure may be optimized for keeping any exchange of thermal energy between the detector area and its surroundings at minimum: the long section 404, short section 406, and heating element 409 as well as the superconductor sections can be formed on a surface of an e.g. silicon chip; the whole can be enclosed in vacuum; and multilayered thermal shields can be set up around the detector. Thermal shielding, and a thermal bath used to cool down the detector for operation, is schematically shown in FIG. 4 as 412. Thermal shielding and cooling can take place using known solutions, and they do not need to be described here in more detail.

In order to ensure that the temperature of the long section 404, short section 406, and heating element 409 is the same, the length of superconductor combining them should be short enough so that heat conductance through it is much higher than the electron-phonon coupling in said normal metal elements. Additionally, as already pointed out above, the heat conductivity of the superconductor sections 405, 407, and 410 should be much smaller than the electron-phonon coupling. When these conditions both hold, the thermal time constant that describes the time scale in which temperature differences even out between the normal metal elements is smaller than the thermal time constant of the whole detector structure, i.e. the time constant that describes how fast thermal energy escapes from the detector to the surrounding thermal bath.

A heating current conducted through the heating input 408 to the heating element 409 will increase the temperature of the heating element 409. The mechanism explained above, i.e. exchange of thermal energy in the form of hot electron diffusion, causes a corresponding increase also in the temperature of the long section 404 (or more generally: the absorber element) and the short section 406 (more generally: the variable impedance element). It is relatively easy to produce low-frequency electric currents of very accurately known magnitude. Thus the amount of energy that will be carried into the detector area by the heating current is also known very accurately. By observing the response of the measurement circuit to a known amount of injected heating current, the detector can be calibrated.

FIG. 5 illustrates schematically an embodiment of a detector 500 that comprises microwave filters 501 and 502 along the first 405 and third 410 lengths of superconductor respectively. A major effect of such microwave filters is to block photonic transport of stray heat along the superconductive connections, which helps to maintain the heat conductance between the detector element proper and the surrounding structure as small as possible.

The microwave filters 501 and 502 can also be used for the purpose of decoupling noise of unwanted frequencies from the detector. The filter 501 along the first length 405 of superconductor is shown as a band-pass microwave filter, the pass band of which is selected so that it only lets through an input signal of the desired frequency. The filter 502 along the third length 410 of superconductor is shown as a low-pass microwave filter, which relates to the fact that a DC or low frequency AC current is used as the heating current. The filter 502 could also be a band-pass microwave filter with its pass band selected way lower than that of filter 501.

The band-pass microwave filter 501 can be made controllable with regard to its middle frequency and/or width of its pass band. Such controllability may be advantageous for example if spectral information is to be obtained from incoming microwave radiation: by controlling the band-pass microwave filter 501 the measurement can be focused into specific spectral portions of the incoming microwave radiation. The controllability of the band-pass microwave filter 501 can also be used even if the incoming microwave radiation only has one frequency (or one frequency band) of interest. In such a case the pass band of the band-pass microwave filter 501 can be e.g. moved back and forth on a wider frequency band that covers the frequency of interest, so that reference measurements are obtained at other frequencies.

FIG. 6 illustrates schematically an embodiment of a detector 600 with a particular arrangement of inputs regarding the heating element. One heating input, which could be called the first heating input and which is coupled to the first end of the heating element 409, comprises a first heating current lead 601 and a first voltage measurement connection 602. Another heating input, called here the second heating input, comprises a second heating current lead 603 and a second voltage measurement connection 604. From these there is a coupling to the second end of the heating element 409.

An advantageous embodiment of such structure is one where the branching of the superconductive strip towards said first heating current lead 601 and first voltage measurement connection 602 is made on the same silicon chip on which also the actual detector is located. Also the branching of the other superconducting strip towards the second heating current lead 603 and second voltage measurement connection 604 is advantageously made on the same silicon chip on which also the actual detector is located. There are low-pass microwave filters 605, 606, 607, and 608 in each of said branches in the embodiment of FIG. 6. The structure may be for example such where couplings from outside of the chip to the branching superconductive strips on the strip is made by ordinary, non-superconductive wires.

The microwave filters shown in the drawings may be discrete components outside the chip proper. However, they should most advantageously be within the same thermal bath in order to achieve the desired blocking of the photonic transport of heat. It is also possible to build microwave filters onto the same chip as the detector itself.

A heating current source is coupled to the first 601 and second 603 heating current leads. In the example embodiment of FIG. 6 the heating current source comprises a series coupling of a (variable DC) voltage source 606, a ballast resistor 607, and a switch 608 coupled across the first 601 and second 603 heating current leads. A voltmeter 609 is coupled across the first 602 and second 604 voltage measurement connections.

The variable DC voltage source 606 may produce an accurately calibrated voltage in the order of some volts, like three volts or the like. The ballast resistor 607 may be an accurately calibrated resistor with a very high resistance, like in the order of one gigaohm or the like. An accurately calibrated voltage source and an accurately calibrated ballast resistor produce a heating current through the heating element 409, which—despite being very small; in the order of three nanoamperes with the numerical values given above—is accurately known. The room-temperature portions of the connections that couple the heating current source to the first 601 and second 603 heating current leads cause some additional resistance, but it can be measured and compensated for. The input impedance of the voltmeter 609 must be very much larger than the impedance of the heating element 409. When the heating current is known and the voltmeter 609 gives the voltage drop across the heating element 409, the amount of power used to heat the heating element 409 can be calculated.

A heating current source like that in FIG. 6, with a variable DC voltage source 606 and an on/off switch 608, can be used to calibrate the detector in a time interleaved manner with the actual detection of microwave radiation. Known amounts of heating power are delivered to the heating element 409 and the corresponding impedance changes in the variable impedance element are noted by measuring e.g. the change of the resonance frequency of a tank circuit where the variable impedance element is a part. For the actual detection of microwave radiation the switch 608 is opened, so that no heating current flows during the actual measurement. An advantage of such calibration is that no additional heat is injected into the detector during the actual measurement, so all such measures of performance that benefit from as low temperatures as possible can achieve their optimal values.

Another possibility is to keep the switch 608 closed also during the actual detection of microwave radiation, and to use a feedback coupling configured to maintain the measured impedance of the variable impedance element constant. Thus the more energetic actual microwave radiation is detected, the less heating current is injected to the detector, and vice versa. Such a measurement method may have a significantly larger dynamic range than one with time interleaved calibrating, but the continuous injection of heating current means that the detector will run slightly hotter than in the method with time interleaved calibrating. Thus the wider dynamic range may come at the cost of some increase in such interference factors that exhibit some proportionality to temperature.

Yet another feature that is schematically shown in FIG. 6 is one alternative geometrical configuration of the long section 404, short section 406, and heating element 409. In FIGS. 4 and 5 the long section 404 and short section 406 had a common longitudinal axis, and the heating element 409 ran parallel to them with some perpendicular displacement. In such an arrangement the long section and short section can actually be manufactured as portions of one and only ohmically conductive strip, with a superconductive strip made to cross said ohmically conductive strip and divide it into two sections. In the detector of FIG. 6 the long section 404, short section 406, and heating element 409 form a pattern that is symmetrical with respect to the longitudinal axis of the short section 406. The long section 404 is equally much displaced to one side from said longitudinal axis of the short section 406 as the heating element 409 is displace to the other side.

While slightly more complicated to manufacture, the symmetric configuration of FIG. 6 involves the advantage that the local conditions for hot electron diffusion between the long section 404 and short section 406 are exactly the same as those for hot electron diffusion between the heating element 409 and short section 406. This may help to ensure that a known amount of calibrating energy delivered to the detector by injecting a heating current to the heating element 409 will cause an identical response to that of the same amount of signal energy coupled to the long section 404.

Figure 7:
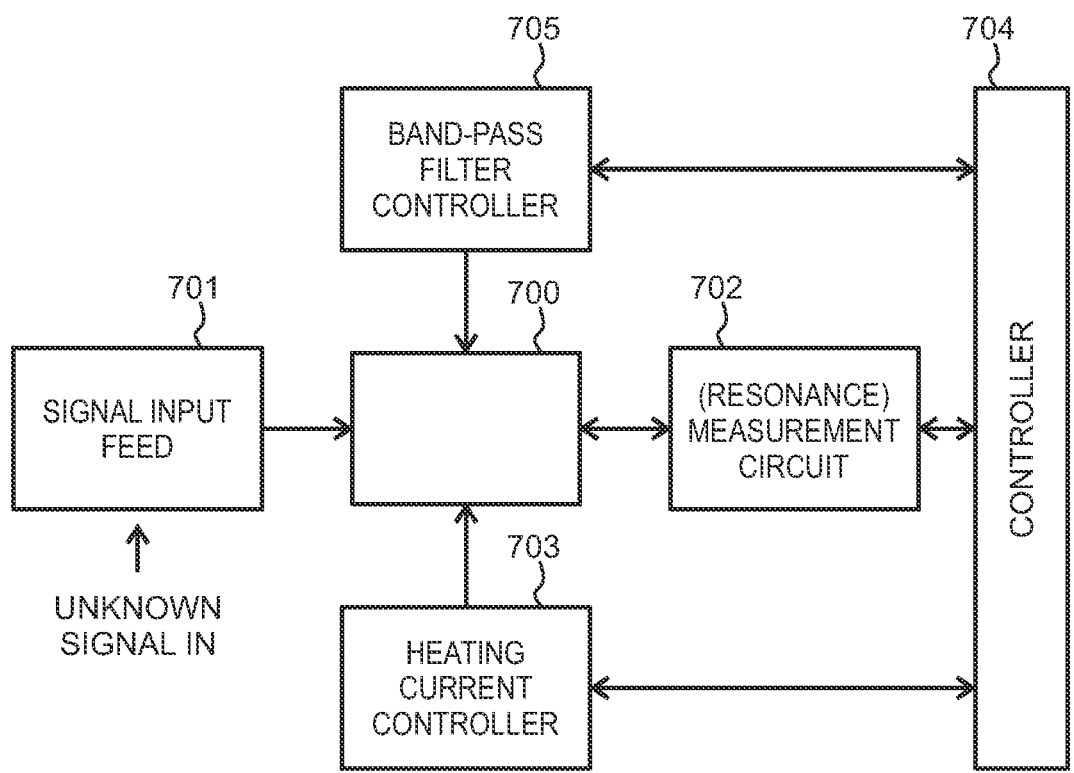
FIG. 7 illustrates a detector arrangement.

FIG. 7 illustrates a detector arrangement according to an embodiment. It comprises at least one detector 700, which can be a detector of any kind described above, most advantageously built as a cryoelectronic chip in which the absorber element, variable impedance element, and heating element as well as the superconductor strips are formed on one or more surfaces of a substrate such as a piece of crystalline silicon. A signal input feed 701 is configured to lead a signal to be measured to a signal input of the detector 700.

The detector arrangement of FIG. 7 comprises a measurement circuit 702, which is configured to measure the effect(s) caused by the changes in the impedance of the variable impedance element in the detector 700. As an example, the measurement circuit 702 may be a resonance measurement circuit configured to measure the resonance frequency of a tank circuit coupled to the detector output of the detector 700.

The detector arrangement of FIG. 7 comprises a heating current controller 703 that is configured to make a heating current of known magnitude flow through a heating input of the detector 700. Both the measurement circuit 702 and the heating current controller operate under the control of a controller 704, which may comprise a programmable computer with suitable input and output connections.

In FIG. 7 it is assumed that the detector 700 comprises a band-pass microwave filter along a first length of superconductor between the signal input and the absorber element of the detector 700. It is further assumed that said band-pass microwave filter is controllable with regard to at least one of the middle frequency and width of its pass band. The detector arrangement comprises a band-pass filter controller 705, which is coupled to a control input of the band-pass microwave filter in the detector 700 and operates under the control of the controller 704.

The heating current controller 703 may comprise components like those shown in the lower part of FIG. 6. In other words, the heating current controller 703 may comprise a series coupling of a voltage source and a ballast resistor, coupled across first and second heating current leads in the detector 700. The heating current controller 703 may also comprise a voltmeter coupled across first and second voltage measurement connections in the detector 700. The voltmeter may also be comprised in some other part of the detector arrangement, like in the measurement circuit 702, as long as it is properly coupled to measure a voltage drop across a resistive heating element in the detector 700.

The controller 704 may be programmed to control the calibration and the actual operation of the detector 700. According to an embodiment, the detector arrangement is configured to calibrate the detector by making the series coupling mentioned above (or any other kind of controllable heating current source) feed a calibrating current through said heating element, and by making the measurement circuit 702 measure corresponding change, like the change in the resonance frequency of the tank circuit where the variable impedance element of the detector 700 is a part. The detector arrangement may also be configured to measure corresponding changes, like corresponding changes in the resonance frequency of the tank circuit, during detection of microwave radiation and to produce a measurement signal indicative of such changes.

Alternatively or additionally the detector arrangement may be configured to make said series coupling (or any other controllable heating current source) feed a compensating current through the heating element in the detector 700 in dependence with a feedback coupling. The aim is then to keep the resonance frequency of the tank circuit constant during detection of microwave radiation. In such a case the detector arrangement is configured to produce a measurement signal indicative of the magnitude of said compensating current, because the magnitude of the compensating current is (inversely) proportional to the amount of detected incoming signal energy.

It is obvious to a person skilled in the art that with the advancement of technology, the basic idea of the invention may be implemented in various ways. The invention and its embodiments are thus not limited to the examples described above, instead they may vary within the scope of the claims. For example, even if the described embodiments have the longitudinal axes of the absorber element, variable impedance element, and heating element all parallel with each other, this is not a requirement of the invention. The longitudinal axes of at least two of the elements may be at oblique angles with each other. For example in a symmetrical embodiment that otherwise follows the principle of FIG. 6 the long section and the heating element may form a V-shaped pattern in which their distant (left-hand) ends are farther from each other than their proximal (right-hand) ends.

The invention is claimed as follows:

1. A detector of microwave radiation, comprising:
    a signal input and a detector output;
    an absorber element of ohmic conductivity, coupled to said signal input through a first length of superconductor; and
    a variable impedance element, the impedance of which is configured to change as a function of temperature, coupled to said detector output through a second length of superconductor,
    wherein:
        the detector comprises a heating input,
        the detector comprises a heating element coupled to said heating input through a third length of superconductor, and
        said absorber element, said variable impedance element, and said heating element are coupled to each other through superconductor sections of lengths shorter than any of said first, second, and third lengths of superconductor to allow hot electron diffusion between said absorber element, said variable impedance element, and said heating element while blocking quasiparticle thermal transport of heat through said first, second, and third lengths of superconductor.

2. The detector according to claim 1, further comprising microwave filters along at least one of said first and third lengths of superconductor.

3. The detector according to claim 1, further comprising a low-pass or band-pass microwave filter along said third length of superconductor.

4. The detector according to claim 1, further comprising a band-pass microwave filter along said first length of superconductor.

5. The detector according to claim 4, wherein said band-pass microwave filter is controllable with regard to at least one of: middle frequency of its pass band, or width of its pass band.

6. The detector according to claim 1, wherein:
    said heating input is a first heating input coupled to a first end of said heating element, and comprises a first heating current lead and a first voltage measurement connection; and
    said detector comprises a second heating input that is coupled to a second end of said heating element, and comprises a second heating current lead and a second voltage measurement connection.

7. The detector according to claim 1, wherein:
    said absorber element and said variable impedance element have a common longitudinal axis; and
    said heating element runs parallel to at least one of said absorber element and said variable impedance element with a perpendicular displacement therefrom.

8. The detector according to claim 1, wherein:
    said variable impedance element has a longitudinal axis; and
    said absorber element and said heating element form a pattern that is symmetrical with respect to the longitudinal axis of said variable impedance element.

9. A detector arrangement for detecting microwave radiation, comprising:
    at least one detector; and
    a resonance measurement circuit configured to measure the resonance frequency of a tank circuit coupled to said detector output,
    wherein:
        the detector is a detector of microwave radiation,
        the detector comprises a signal input, a detector output, an absorber element of ohmic conductivity coupled to said signal input through a first length of superconductor, and a variable impedance element the impedance of which is configured to change as a function of temperature, the variable impedance element is coupled to said detector output through a second length of superconductor, the detector comprises a heating input, the detector comprises a heating element coupled to said heating input through a third length of superconductor, and said absorber element, said variable impedance element, and said heating element are coupled to each other through superconductor sections of lengths shorter than any of said first, second, and third lengths of superconductor to allow hot electron diffusion between said absorber element, said variable impedance element, and said heating element while blocking quasiparticle thermal transport of heat through said first, second, and third lengths of superconductor.

10. The detector arrangement according to claim 9, further comprising:

a heating current controller configured to make a heating current of known magnitude flow through said heating input.

11. The detector arrangement according to claim 10, wherein:

said heating input is a first heating input coupled to a first end of said heating element in said detector, and comprises a first heating current lead and a first voltage measurement connection;

said detector comprises a second heating input that is coupled to a second end of said heating element in said detector, and comprises a second heating current lead and a second voltage measurement connection;

said heating current controller comprises a series coupling of a voltage source and a ballast resistor, coupled across said first and second heating current leads; and said detector arrangement comprises a voltmeter coupled across said first and second voltage measurement connections.

12. The detector arrangement according to claim 11, wherein:

the detector arrangement is configured to calibrate the detector by making said series coupling feed a calibrating current through said heating element and measuring corresponding change in the resonance frequency of the tank circuit; and the detector arrangement is configured to measure changes in the resonance frequency of the tank circuit during detection of microwave radiation and to produce a measurement signal indicative of such changes.

13. The detector arrangement according to claim 11, wherein:

the detector arrangement is configured to make said series coupling feed a compensating current through said heating element in dependence with a feedback coupling to keep the resonance frequency of the tank circuit constant during detection of microwave radiation; and the detector arrangement is configured to produce a measurement signal indicative of the magnitude of said compensating current.

* * * * *